(12) United States Patent
Maragal

(10) Patent No.: US 8,744,637 B1
(45) Date of Patent: Jun. 3, 2014

(54) METHODS AND APPARATUS FOR DETECTING THE CLEARANCE OF FAULT IN SHUNT REACTOR COMPENSATED TRANSMISSION LINES

(71) Applicant: Deepak Maragal, Bridgewater, NJ (US)

(72) Inventor: Deepak Maragal, Bridgewater, NJ (US)

( * ) Notice: Subject to any disclaimer, the term of this patent is extended or adjusted under 35 U.S.C. 154(b) by 0 days.

(21) Appl. No.: 14/025,111

(22) Filed: Sep. 12, 2013

(51) Int. Cl.
  *G05D 9/00* (2006.01)
  *G01R 31/00* (2006.01)
  *G01R 13/00* (2006.01)

(52) U.S. Cl.
  USPC ............... 700/294; 702/58; 702/70; 702/77

(58) Field of Classification Search
  CPC ...... G01R 31/085; G01R 23/16; H02H 7/267; H02H 1/00
  USPC ............ 700/292–294; 702/58, 59, 66, 70, 77
  See application file for complete search history.

(56) References Cited

U.S. PATENT DOCUMENTS

| 7,317,599 | B2 * | 1/2008 | Khoroshev et al. | 361/42 |
| 2011/0148430 | A1 * | 6/2011 | Yang et al. | 324/543 |
| 2012/0176712 | A1 | 7/2012 | Kim et al. | |

FOREIGN PATENT DOCUMENTS

EP   2319151 A1   5/2011

* cited by examiner

*Primary Examiner* — Sean Shechtman

(57) ABSTRACT

The objective of this patent is to describe novel methods and device systems for detecting the fault-cleared state in a shunt compensated transmission line. The methods are applicable in all types of transmission line types and faults, in any type of reclosure mechanism, and can be implemented in existing devices such as relays and not need sophisticated equipment. One application of detecting the fault-cleared state is adaptive reclosure in which case, substantial improvement in transmission system reliability and benefits in protection can be achieved.

13 Claims, 16 Drawing Sheets

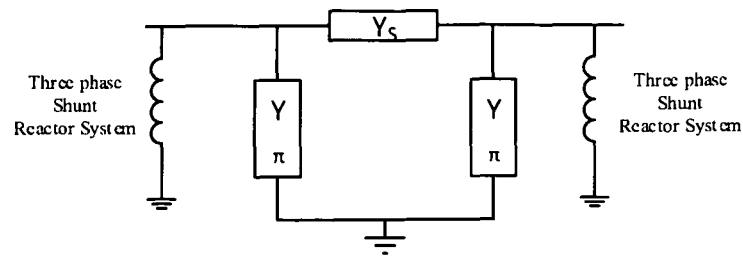
FIG 3A - π Equivalent Circuit
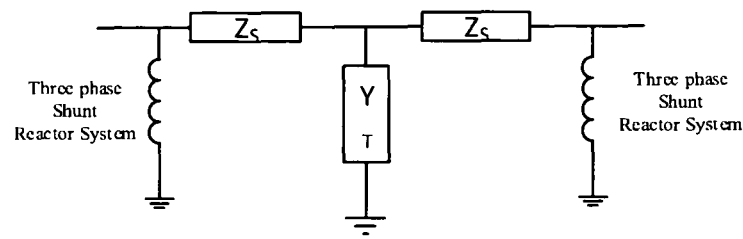
FIG 3B T Equivalent Circuit
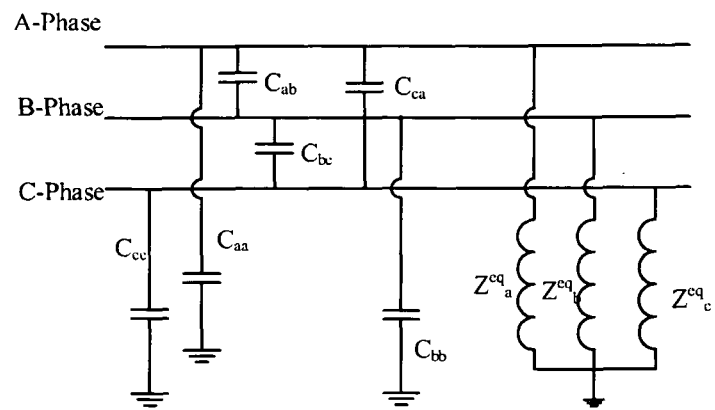
FIG 3C - Reduced System
(Prior Art)

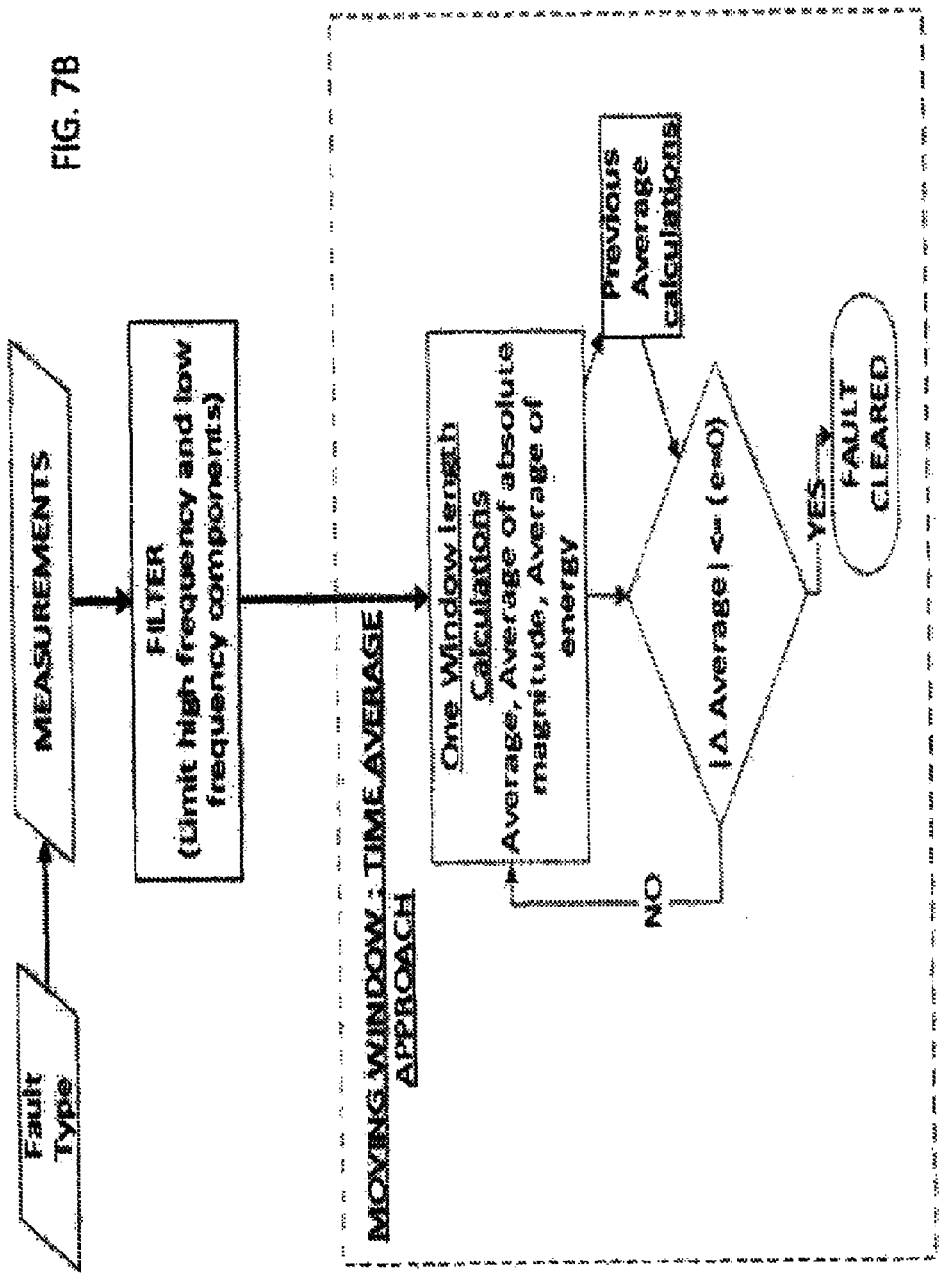

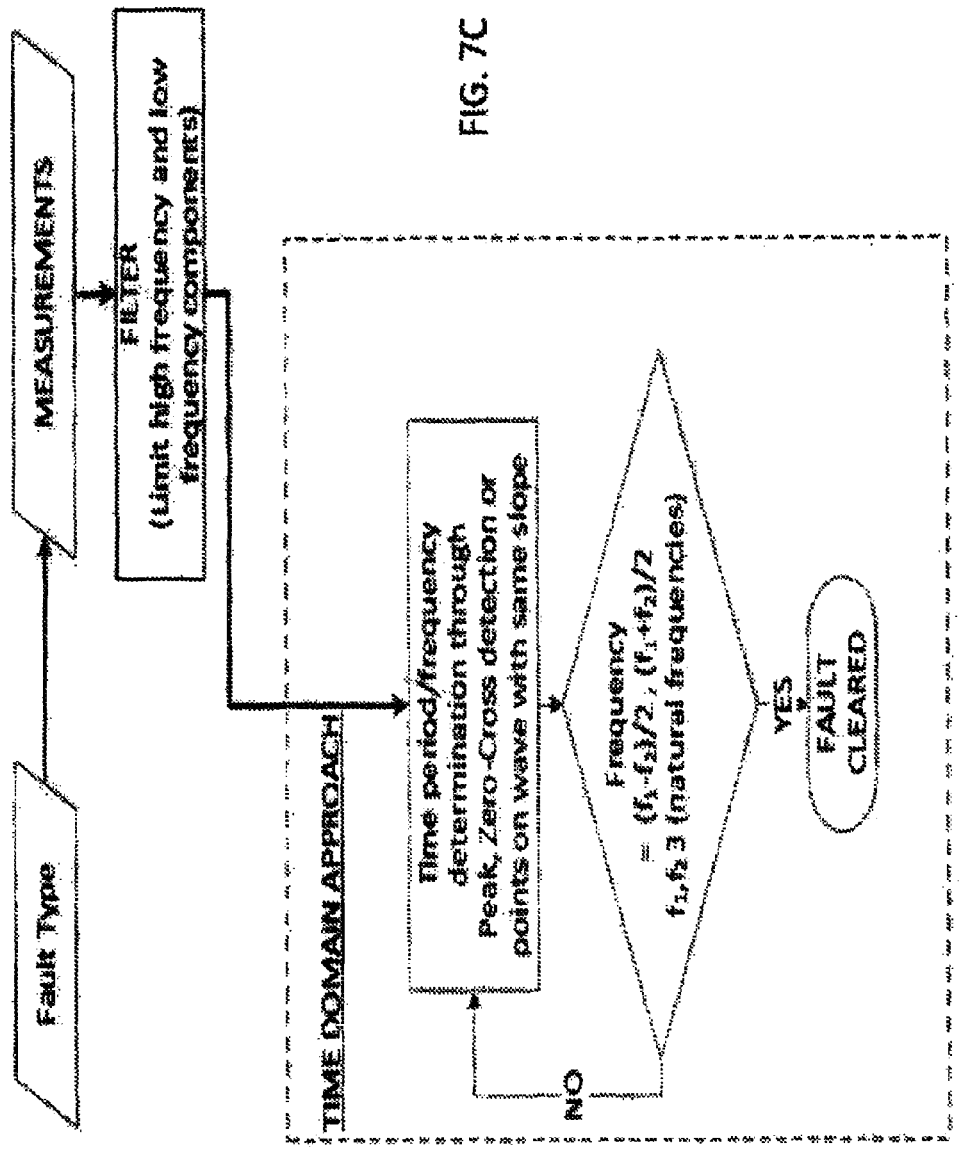

METHODS AND APPARATUS FOR DETECTING THE CLEARANCE OF FAULT IN SHUNT REACTOR COMPENSATED TRANSMISSION LINES

BACKGROUND OF THE INVENTION

1. Field of the Invention

This application relates to detecting fault in transmission lines with shunt reactors, in particular, to the fault clearance detection methods and systems in transmission lines with shunt reactors. When fault occurs on a transmission line with shunt reactors, circuit breakers on both ends open to isolate the fault from rest of power system, however, the shunt reactors stay connected to the line. Once, the fault is cleared, circuit breakers can be reclosed for normal operation. This invention describes the methods and apparatuses to detect the fault cleared state in wide variety of faulty types and conditions, which can be used for reclosure.

2. Description of the Related Art

FIG. 1 elucidates the schematic of a transmission line with two end shunt reactors system. Faults on a transmission line occur due to man-made and/or natural causes. These faults can be temporary or transient which extinguish (or clear) themselves after a certain period (ms to sec). The faults can be permanent which would need longer time to clear (hours to days) through manual intervention by line crew. Since majority of transmission line faults are temporary, fixed time delay based automatic reclosure techniques are currently employed in many utilities to re-energize the transmission line with and without shunt reactors to increase the reliability of transmission system. IEEE Guide for "Automatic Reclosing of Line Circuit Breakers for AC Distribution and Transmission Lines", IEEE C37.104-2002, April 2003 and Chapter-14 of Alstom Inc., "Network Protection and Automation Guide", 2011 outline several design considerations for implementing automatic reclosure for transmission lines.

Different transient characteristics are expressed in a shunt reactor compensated transmission line during fault existence and after the fault clearance. These characteristics are highlighted in FIG. 2 using faulty phase voltage measurements. The techniques used to detect the fault clearance on transmission line without shunt reactors are not effective in transmission line with shunt reactors. Taking advantage of ringing (or beat frequency) phenomenon expressed in such transmission lines; researchers have proposed several techniques to distinguish temporary and permanent faults. The ringing phenomenon occurs due to exchange of energy between line capacitances and shunt reactors. The voltage built on a transmission line after fault is cleared is referred as recovery voltage. An adaptive reclosure technique can be considered in different ways based on the detection. Three ways of detections are:

1) The technique detecting the instant of fault clearance by analyzing transients;
2) The technique detecting the instance of fault clearance by matching the specific signatures expressed in the transients of faulty phase of transmission line;
3) The technique detecting the distinguishing characteristics expressed by the transmission line during temporary and permanent faults.

The same algorithms can be used in all the above three defined detection approaches. Conversely, a detection algorithm to identify the clearance of fault can also be interpreted to identify the existence of temporary/permanent fault for achieving adaptive reclosure. Adaptive reclosure algorithms utilize shunt reactor currents and terminal voltage measurements to identify the transient and permanent faults. Adaptive reclosure can be implemented in two scenarios:

1) All three phases of transmission line trip to isolate the fault and three phases can be adaptively energized after clearance of the fault.
2) In case of single line to ground faults, only faulty phase is tripped keeping the other two healthy phases energized. The fault phase is adaptively energized after clearance of the fault. This operating mechanism is referred as Single phase adaptive reclosing (SPAR).

The prior art in adaptive reclosure can be understood by classifying detection techniques into the below mentioned categories:

Recovery Voltage based Methods:

In US patent, publication number U.S. Pat. No. 7,317,599 B2, fault clearance in a shunt compensated transmission line is detected and applied for SPAR by measuring the frequency content when the recovery voltage goes beyond certain limit (nominal value). Even though, this approach is effective in a single-phase (or line) to ground fault (SLG), but it is not applicable in other kinds of faults with three phase opening.

In another US patent publication number US20120176712 A1, even to odd harmonic ratio has been used to detect the fault clearance state. However, harmonic ratio will not be effective in transmission systems having multiple frequency components in recovery state and fault dependent damping factors.

In IEEE Bologna Power Tech Conference Proceedings, 2003, a publication on "750 kV reactive power control, automatic reclosing and overvoltage protection", proposed single phase and three phase reclosing by sensing the extinction transients in the line voltage by means of special filters. The reclosure command is initiated when the recovery voltage in the faulty phase exceeds the set limit.

At $3^{rd}$ International Conference on Electric Utility Deregulation and Restructuring and Power Technologies, a publication on "Power spectrum of fault phase voltage based single-phase adaptive reclosure" proposed SPAR operation based on the detection of frequency components in the recovery voltage which consist of power frequency and resonant frequency components in temporary faults, and only have power frequency components in permanent faults.

Pattern matching/Estimation approaches

Pattern Matching Method:

A European Patent publication number EP2319151 A1 (US 20110148430 A1) describes the methodology to detect a temporary or a permanent fault by comparing the transients in a transmission line with the pre-determined pattern. A threshold value has been used for wide-varying fault types, fault resistances and fault durations to compare the degree of similarity. The pattern matching technique will not be effective in those fault conditions when one or more frequency components during recovery period are damped.

Parameter Identification Methods:

Another publication at $3^{rd}$ International Conference on Electric Utility Deregulation, Restructuring and Power Technologies on "Study on single-phase adaptive reclosure scheme based on parameter identification" used instantaneous shunt reactor current and voltage measurements to determine resistance, inductance and capacitance parameters of the transmission lines. Comparing the continuously calculated shunt and neutral inductances against actual values served to distinguish temporary and permanent faults. The proposed SPAR technique needs appropriate scaling factors to account for modeling errors resulting from model simplification, sampling precision and oscillating components.

Similar scheme has been utilized by another publication on "Permanent Faults Identification for Three-phase Autoreclosure on Transmission Lines with Shunt Reactors" at International Conference on Advanced Power System Automation and Protection, 2011 to estimate the parameters of shunt and neutral inductances but, a zero modal circuit has been utilized for calculations and the paper proposed the reclosure application on phase-phase fault.

Voltage/Current Estimation Methods: SPAR Techniques

Voltage or current through the neutral or shunt reactor is calculated using transient fault model. The comparison of calculated current versus measured current has been used to determine the nature of fault. Difference between the estimated and calculated voltages across shunt reactor on double circuit line has been utilized to detect a temporary versus permanent fault in the paper "Fault nature identification for single-phase adaptive reclosure on double circuit Extra High Voltage (EHV) transmission lines with shunt reactors" published in International Conference on High Voltage Engineering and Application, 2010.

Similarly, current estimation and comparison through difference, ratio and scaling factor calculations have been utilized to identify the fault nature in the paper titled "A Novel Single-Phase Adaptive Reclosure Scheme for Transmission Lines With Shunt Reactors" published in IEEE Transactions on Power Delivery, April 2009.

Reactor Current Methods:SPAR Techniques

Shunt reactor current has low frequency and power frequency components in a single phase operation in transient faults, however permanent faults have only power frequency and decaying dc components. An energy function calculated through differences in current samples between two time instants has been used to eliminate the fundamental and dc components and retain the low frequency component in order to detect nature of fault in "Single-Phase Adaptive Reclosure of EHV Transmission Lines Based on Shunt Reactor Current Identification" published in Power and Energy Engineering Conference, Asia-Pacific, 2009.

A similar dual window energy ratio method has been proposed in paper "A Dual-Window Transient Energy Ratio-Based Adaptive Single-Phase Reclosure Criterion for EHV Transmission Line" published in", IEEE Transactions on Power Delivery, 2007.

A Prony signal analysis method which fits the sampled data of reactor current into set of linear exponentials has been utilized in publication "New Algorithm for Adaptive Single-phase Reclosure on EHV Transmission Lines" in Power and Energy Engineering Conference, Asia-Pacific, 2011 to identify the low frequency component characteristics in a transient fault to initiate reclosure.

Comparison of ratio of amplitude of low frequency component and power frequency component of the current on the open phase has been utilized to distinguish permanent faults from transient faults in paper "Study on Free-oscillation Components Characteristics and Single-phase Adaptive Reclosure in Reactored Transmission Lines" published in Power and Energy Engineering Conference, Asia-Pacific, 2010.

Comparison of summation and differences in the current measured in either ends of shunt reactors has been used to identify single phase permanent fault and block reclosure in paper "Single-Phase Permanent Fault Detection for Reactored EHV/UHV Transmission Lines" published in", Power and Energy Engineering Conference, Asia-Pacific, 2011. Threshold and scaling factors have been utilized in decision making.

Characteristic analysis of current in the shunt reactors and voltage on the open phase has been performed in paper "Single-phase Adaptive Reclosure for EHV and UHV Transmission Lines with Shunt Reactors" published in Power and Energy Engineering Conference, Asia-Pacific, 2010. The paper proposed the comparison of the ratio of maximum and minimum envelope line of the ringing waveform of shunt reactor and line voltage against the thresholds to identify transient and permanent faults. Due to higher max/min ratios in reactor currents than terminal voltage measurements, the current based criterion was proposed as a primary method of detection and voltage based criterion as a backup.

The traditional fixed time delay based reclosure approaches are not reliable and result in unnecessarily prolonging the reclosure in case of temporary faults, or unsuccessful reclosure attempts in case of permanent fault which adversely impacts the life of substation and transmission line equipment and also negatively affects the system stability.

Many of the proposed adaptive reclosure methods utilize thresholds and multiplication factors to identify the clearance of secondary arc and to differentiate transient versus permanent faults. There is no direct method to calculate these factors; determination of scaling factors may need an extensive study or broad experience on wide variety of faults. Thus, these factors are set to a higher value to be conservative and reliable in order to preclude false-positive results. This leads to de-sensitization of detection algorithm and adversely impact the results in 2 ways:

The reclosure may get delayed until the observed parameter goes above threshold value. Incorrectly interpret transient fault as permanent and block reclosure in case of transient faults that fall below threshold.

Even though, some adaptive reclosure techniques proposed in the paper use transmission line parameters in adaptive reclosure detection algorithms, there is no explanation on the length of window that needs to be used in time domain for calculations and detection. This information determines the efficacy of an algorithm under different fault conditions. An arbitrary window length will not be able to capture the transients to integral multiple cycles and will result in wide variations in frequency especially at smaller window lengths.

Some of the adaptive reclosure techniques utilize lumped circuit representation model to identify parameters. This approximation leads to inaccuracies in estimation and thus requires scaling factor to account for differences. Any usage of scaling factor results in de-sensitizing the detection algorithm as mentioned above.

All the proposed adaptive reclosure techniques are applicable only in case of single phase operation and single line to ground faults except for one paper which proposed three phase reclosure on SLG fault and another paper illustrated the technique on line-line fault. None of the approaches are applicable universally for all kinds of faults namely, SLG, two phase/line to ground fault (2LG), three phase/line to ground fault (3LG), phase-to-phase/line-line fault (LL or 2L) and single phase adaptive reclosing (SPAR).

Some of the adaptive reclosure techniques which depend on amplitude of the recovery voltage/current are sensitive to longer fault durations as the much of the energy in the transmission line is dissipated in the fault resulting in smaller amplitude of recovery voltage and currents. The same limitation also applies depending on the instant of fault on the sine wave. The fault current is inductive in nature and lags voltage by 90°. The initial conditions and the energy contained in faulty/healthy phase depend on the instant of the fault.

Due to above limitations, the proposed adaptive reclosure techniques are not reliable and easy to implement and hence not a single method has a wide implementation across power industry. In order to increase the reliability of these techniques, some researchers have considered further augmenting the decision process with additional statistical and neural network techniques. However, these kinds of techniques need lot of previous history fault records for training purposes which is practically not feasible making them difficult to implement.

Summarizing the current state of art on fault clearance detection, the requirements of an effective and efficient adaptive reclosure method are that, it needs to be applicable under various types of fault conditions, provide fast response, easy to configure, able to implement in field without needing sophisticated equipment. The method described in this patent addresses all these requirements.

SUMMARY OF THE INVENTION

This invention describes novel methods and techniques to detect fault clearance in a shunt reactor compensated transmission line. Timely detection of fault clearance can ensure successful reclosure in a short interval through the application of adaptive reclosure techniques. Inability to detect the fault clearance indicates the existence of permanent fault wherein reclosure can be blocked preventing damage to the transmission and substation equipment.

The method and apparatus of detecting the instance of fault clearance in any type of fault or distinguishing a temporary versus permanent fault or detecting the healthy condition in a shunt reactor compensated transmission line consists of below mentioned steps, wherein each step may be independently practiced using product and/or services of one entity or different entities to accomplish the said objectives in the described manner:

determining the unique characteristics expressed by the transmission line with shunt reactor system during fault and fault cleared condition, determining the parameters for feature extraction algorithm such as the non-leakage or acceptable spectral leakage window lengths, modal transformation matrix, frequency settings, threshold values, settling times, implementing detection algorithms which can either independently or in combination be applied to identify/extract the said unique characteristics in a protection relay and/or standalone system comprising of analog, digital, discrete, and memory systems, wherein appropriate settling time and thresholds are used to qualify the results. The means of determining the unique characteristics comprise of frequency-domain, time-domain, modal domain and field measurement techniques and involve the determination of resonant frequencies and relative magnitudes between the resonant frequencies.

The methods and techniques are based on electro-magnetic principles and are applicable to wide variety of transmission line types, fault types and fault durations. They are simple to configure and implement in existing protection devices or external devices and do not need sophisticated equipment.

BRIEF DESCRIPTION OF THE DRAWINGS

FIGS. 3A, 3B, and 3C represent equivalent circuits of the transmission line with shunt reactors.

FIG. 7B represents flow chart to implement detection algorithm based on moving window time average approach FIG. 7C represents flow chart to implement detection algorithm based on time domain approach

DETAILED DESCRIPTION OF THE INVENTION

The term transmission line is referred to one or more power carrying conductors which are arranged in spatial proximity to each other either in full section or partial sections. Types of transmission lines include overhead, underground, cables, single phase, multi-phase, single circuit, multi-circuit, parallel tower transmission lines. The purpose of this description is to explain the approach and methodologies which can be used to detect the healthy state of the transmission line with shunt reactor system, or to detect the instance of fault clearance, or to categorize the fault as temporary or permanent and then explain different approaches to implement the algorithms in a real system. The said purpose is explained by considering in three steps:

Determining the frequency characteristics expressed by transmission line with shunt reactor system in different conditions, Implementing different types of detection algorithms, Determining the parameters for detection algorithms.

Simulations using actual parameters of New York Power Authority's (NYPA) 765 kV overhead untransposed transmission line (3 phase conductors and 2-shield wires) and shunt reactor system with no neutral reactor have been used for illustrating various methodologies and techniques throughout this patent application.

Energy contained in electric and magnetic circuit in any kind of transmission line with shunt reactors connected either from one-end or both ends of line exhibits stable resonance conditions in the open (or isolated) phases/conductors of the transmission line. The energy contained in the isolated phase will oscillate at natural frequency which is unique to the transmission line and shunt reactor system. Some methods to determine the resonant characteristics/natural frequencies expressed in the transmission line system are:

Analytical Method:

Use equivalent circuits such as Pi or T models to represent the transmission line. FIGS. 3A & 3B depict two such representations. Distributed parameter models can be used to determine the equivalent lumped capacitance, resistance, inductance and conductance parameters of the transmission line. The method to calculate such parameters from transmission line conductor dimension and material properties is well explained in the literature. The equivalent parameters can be represented in matrix form with mutual coupling factors. The equivalent admittance ($Y_{eq}$) and impedance ($Z_{eq}$) parameters can be calculated using circuit reduction techniques and the reduced circuit is shown in FIG. 3C for a 3-phase single circuit transmission line Eigen value theory (eig function) can be used to determine the set of natural frequency {f} of oscillation for a coupled system.

$$\{f\} = \text{imaginary}\left\{eig\left(\left[2\pi\sqrt{[Z_{eq}][Y_{eq}]}\,\right]^{-1}\right)\right\} \quad (1)$$

Figure 1:
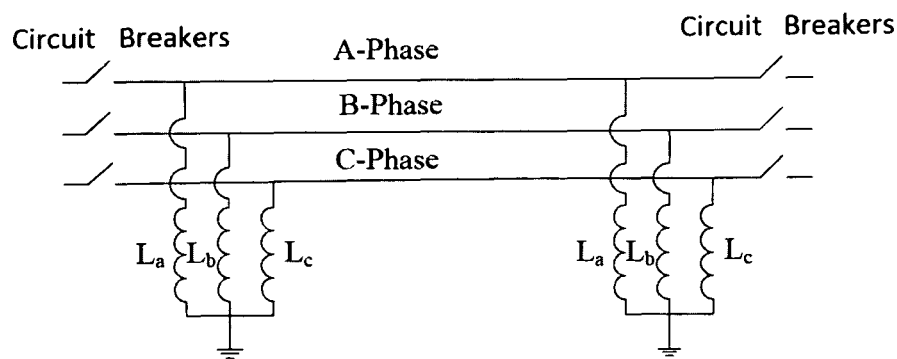
FIG. 1 represents schematic of transmission line with shunt reactors system.
Figure 2:
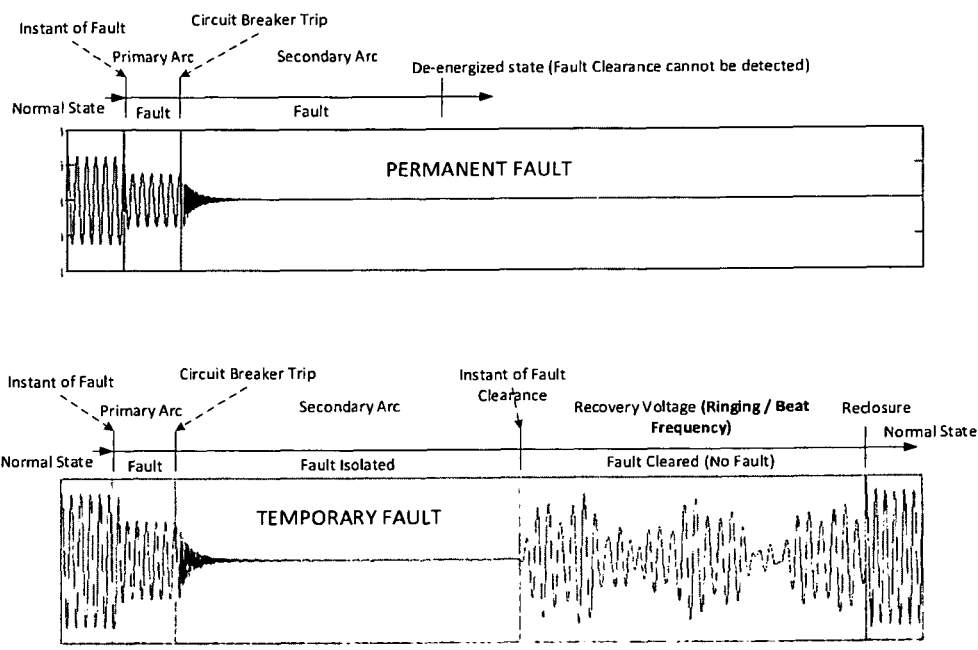
FIG. 2 represents typical faulty phase terminal voltage waveform in permanent and temporary faults.
Figure 4A:
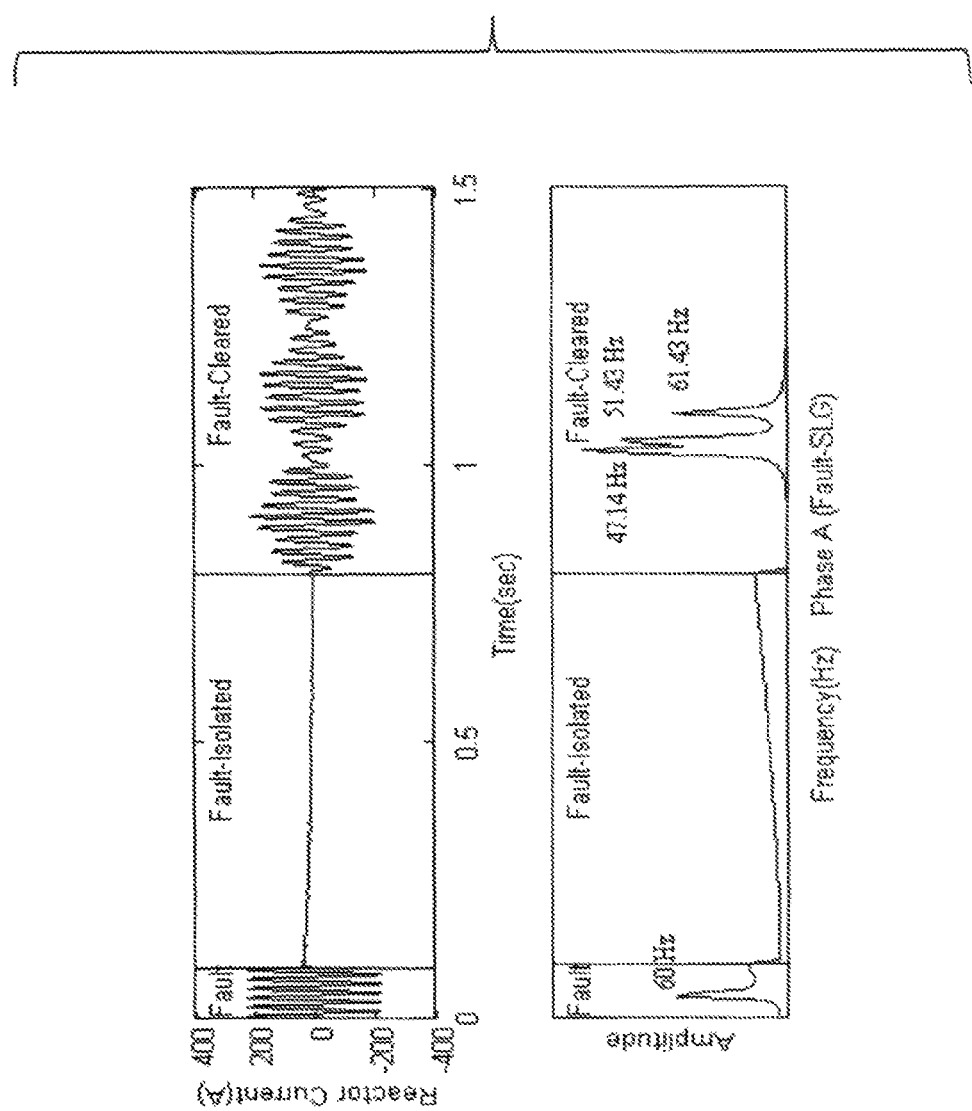
FIG. 4A illustrate the natural frequencies of NYPA's 765 kV transmission system determined through time-domain FFT approach.

Simulation Method:

A transmission line with dimensions and material properties or circuit parameters can be represented in Electro Magnetic Transient software such as EMTP-RV, EMTP-DC, ATP, Matlab, TNA and a time-domain transient solution can be used to determine the resonant characteristics. Since the energy in isolated phase oscillates at resonant frequency, the FFT (Fast Fourier Transform) of time domain simulation during this period would yield the natural frequencies. One of the ways to measure the energy is to through voltage and current measurements. FIG. 4A illustrates one such analysis performed on shunt reactor current measurements on NYPA's 765 kV transmission line system, where the diagrams show in contrast the patterns of Fault-Isolated and Fault-Cleared states and the frequencies in extracted in those states.

Figure 4B:
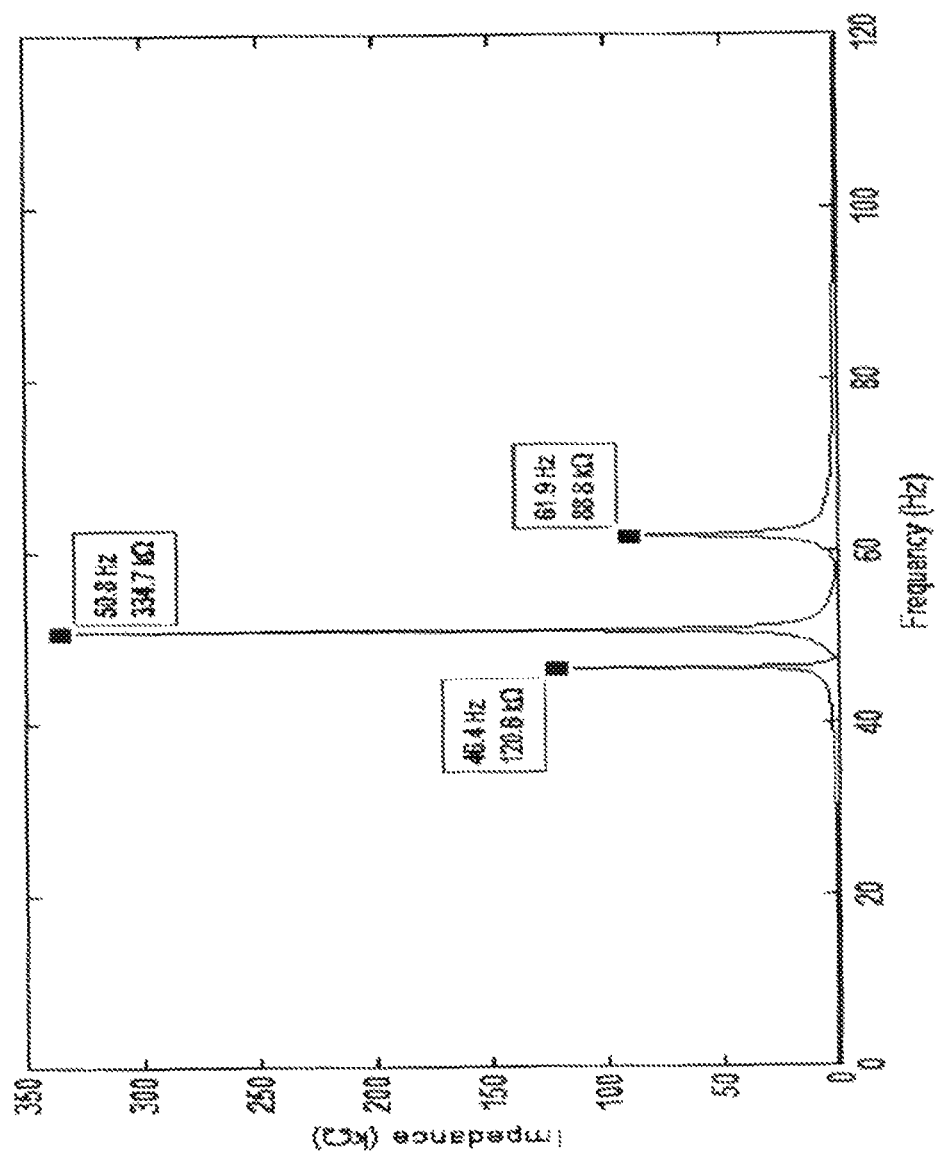
FIG. 4B represents the impedance versus frequency plot determined through frequency scan EMTP simulations on NYPA's 765 kV transmission system.

Alternatively, more accurate computations through frequency scan solution can be performed by computing the magnitude and angle of input impedance at each frequency. At resonance condition, the impedance of the transmission line with shunt reactor system will be very high and the angle takes a jump from 0 to 180° or from vice versa. FIG. 4B illustrates the impedance plots performed on NYPA's 765 kV transmission line. Instead of impedance computation, the magnitude and angle in voltage or current or their derivatives quantities (admittance, energy, power etc.) in an external source or in any of transmission line and shunt reactor circuit elements can also be used to determine the resonant frequencies.

Field Measurements:

If an energized transmission line with shunt reactor system is isolated from the grid, the energy contained in the isolated system will oscillate at natural frequencies. These frequencies can be obtained from voltage or current measurements or their derivatives (such as real power, apparent power, reactive power, time-derivative, integral) by using digital signal processing algorithms such as FFT performed on integral multiple cycles of the recorded waveform. Similar measurements and calculations can also be performed on digital fault records to extract the frequencies in different fault conditions.

Since, the beat frequency phenomenon exist primarily due to coupling between capacitance of transmission line and shunt reactor inductance, the natural frequencies will be close to power frequency based on the degree of reactor compensation, one of the resonant frequency will be at power frequency if the degree of compensation is 100%. Hence, existing measurement devices such as current and potential transformers, capacitive voltage transformers can be used for measurements without needing sophisticated measurement devices. This does not preclude the usage of higher precision, wide bandwidth measurement equipment.

During fault condition, the resonant frequencies change due to re-configuration of transmission line. The resonant frequencies under each type of fault such as SLG, 2LG, 3LG, 2L, 3L and SPAR faults for each phase of transmission line can be determined using the above defined approaches. The resonant frequencies in a transmission system for each fault type can be considered fixed as they are less sensitive to fault location and fault resistance variations. The summary of resonant frequencies expressed during fault and recovery state on a NYPA's 765 kV transmission line system are highlighted in Table 1. The above three described methods are just the means to extract the defined unique characteristics of transmission line system, there exist many other ways to extract these characteristics using other forms of analytical, circuit theory, model reduction, and field measurement techniques.

TABLE 1

Summary of characteristics of various types of faults on NYPA's 765 kV transmission line with shunt reactors (without neutral reactors)

| Fault Type | New natural frequencies during fault (Secondary Arc) | | Recovery Transients (Magnitude) |
|---|---|---|---|
| | Faulty Phase | Healthy Phase | |
| SLG Phase-A | NIL | 47.5 Hz, 57.5 Hz (both) | 46.4 Hz, 50.8 Hz, |
| SLG Phase-B | | 50.9 Hz, 53.9 Hz | 61.9 Hz in end phase (A, C) |
| 2LG Phase-AB | | 52.3 Hz | 46.4 Hz, |
| 2LG Phase-AC | | 51.2 Hz | 61.9 Hz in |
| 3LG | | NIL | center phase |
| LL Phase-AB | 49.6 Hz, 61.9 Hz | 49.6 Hz, 61.9 Hz | (B) |
| LL Phase-AC | 46.4 Hz, 62 Hz | 46.4 Hz, 62 Hz | |
| 3L | 61.8 Hz | NIL | |
| SLG-A (SPAR) | NIL | 60 Hz | 52.3 Hz, 60 Hz |
| SLG-B (SPAR) | | | 51.3 Hz, 60 Hz |

Figure 5A:
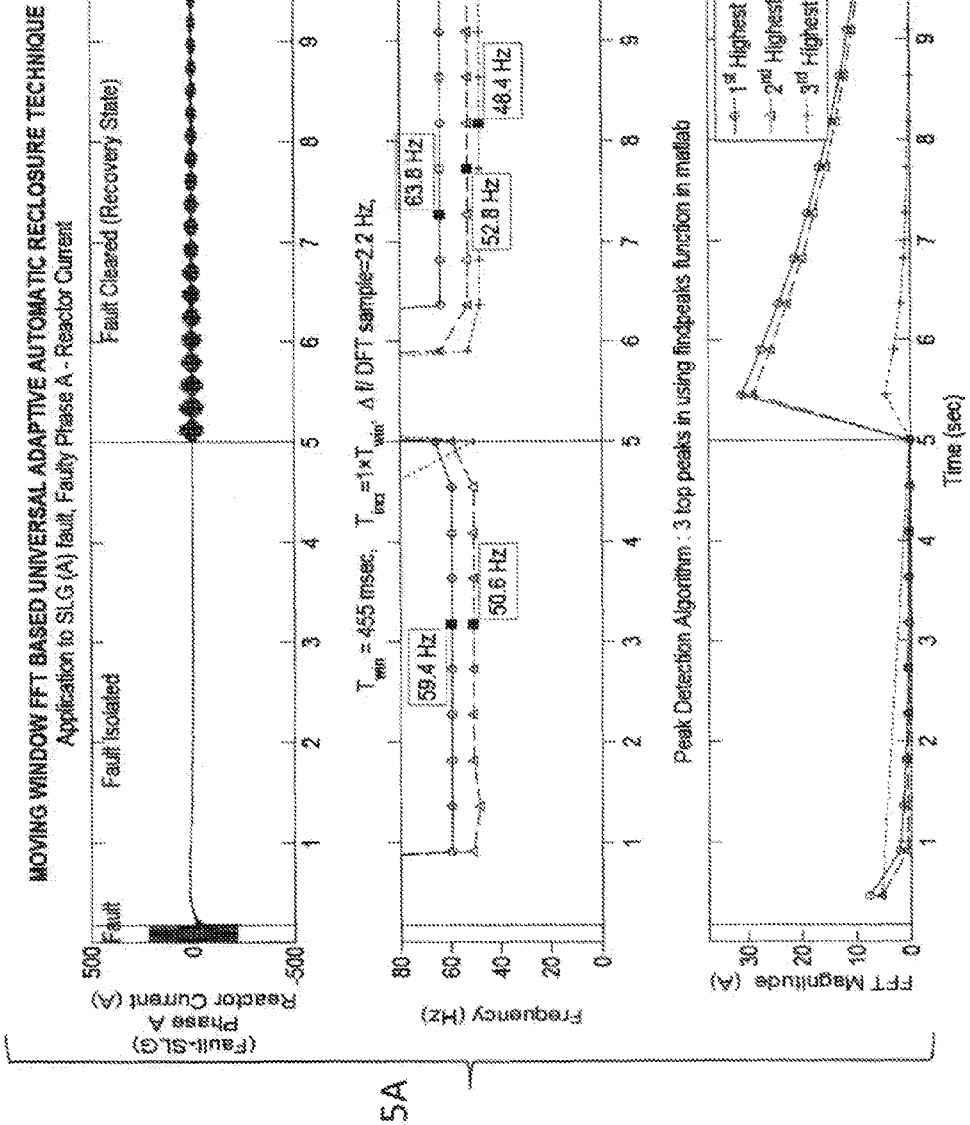
FIG. 5A illustrates the Moving Window DFT Calculations: Frequency comparison approach with the identification of all natural frequencies in the recovery state

The characteristics expressed during fault have different signature compared to fault cleared condition, different techniques can be used to extract these characteristics in real-time for detecting the fault clearance state. Any or all healthy, faulty phase voltage and/or current measurements and/or its derivatives such as real-reactive power on transmission line or reactors can be used in fault clearance detection techniques. The techniques or the algorithms to implement in a protection relay or an external device to detect the clearance of fault, comprise of below mentioned approaches:

Moving Window Calculations Approach:

Perform sliding or moving window calculations to extract the frequency content in transients using the predetermined window length. The detected frequency can be compared against know values (as in Table I) to identify the state of the fault. Some of other techniques using non-leakage window length or acceptable leakage window length using similar approach are:

Technique I: Perform moving/sliding window DFT/FFT (Discrete/Fast Fourier Transform) calculations with fixed window length and check if the peaks in frequency spectrum coincide with all three natural frequencies of the transmission line circuit for certain time duration; presence of natural frequency components signals the clearance of fault. During fault condition, even if resonance exists in healthy and faulty phases, the resonant frequencies will be different from the natural frequency components of healthy transmission system, which serves to distinguish the fault and the fault cleared state. FIG. 5A demonstrates the technique on NYPA's 765 kV transmission system whose resonant frequencies are shown in FIG. 4B.

Technique II: Perform moving window DFT/FFT calculations with fixed window length and check if the number of stable (constant for certain duration) peaks in frequency spectrum coinciding with natural frequencies increase over time. During fault, the resonance frequencies in a transmission system are smaller in number and remain same during the entire duration of fault. After fault clearance, the transmission system exhibits natural frequencies of resonance which are higher in number. Depending on the fault condition and energy level in the transmission system, all natural frequencies may not appear after fault clearance; this technique is effective in such situations. FIG. 5A demonstrates the technique on NYPA's 765 kV transmission system.

Figure 5B:
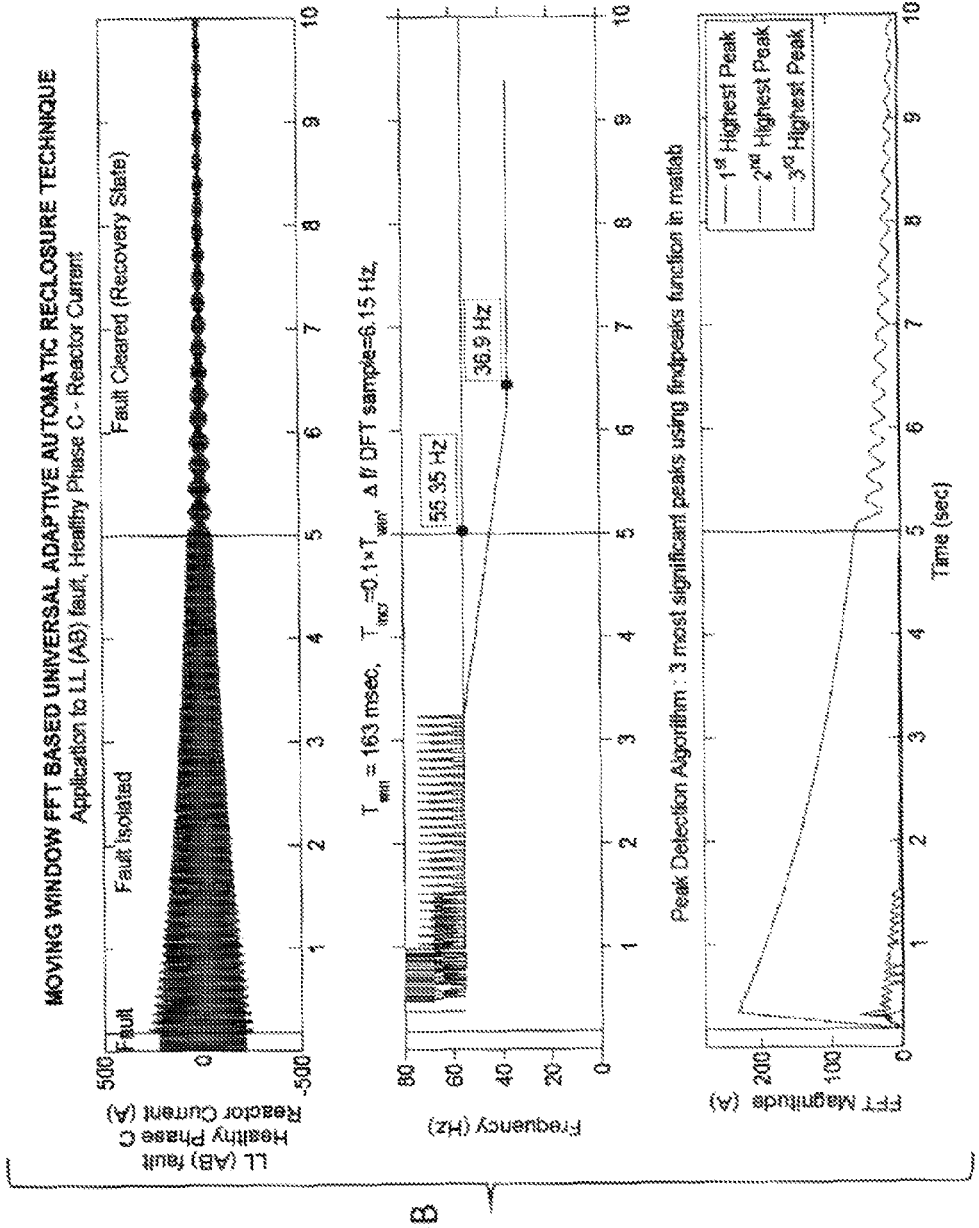
FIG. 5B illustrates the Moving Window DFT calculations: Monotonous decay of DFT Magnitude during fault with the non-leakage window length chosen for the fault type.

Technique III: Perform moving window DFT calculations using the non-leakage window length set for a specific fault type, the peak magnitude of DFT calculations will decay monotonously until the frequency contained in the transients corresponds to non-leakage window. When the fault is cleared, the frequency response of the transmission system changes, and the DFT magnitude calculated through the older window length will result in variations and not yield monotonicity. FIG. 5B application of this technique and variations on NYPA's 765 kV transmission system.

In a similar manner, it is also possible to choose the non-leakage window length to capture the recovery transients rather than fault transients depicted in FIG. 5B, in which case the variations will happen during fault and monotonous decay will happen in recovery period.

Figure 5C:
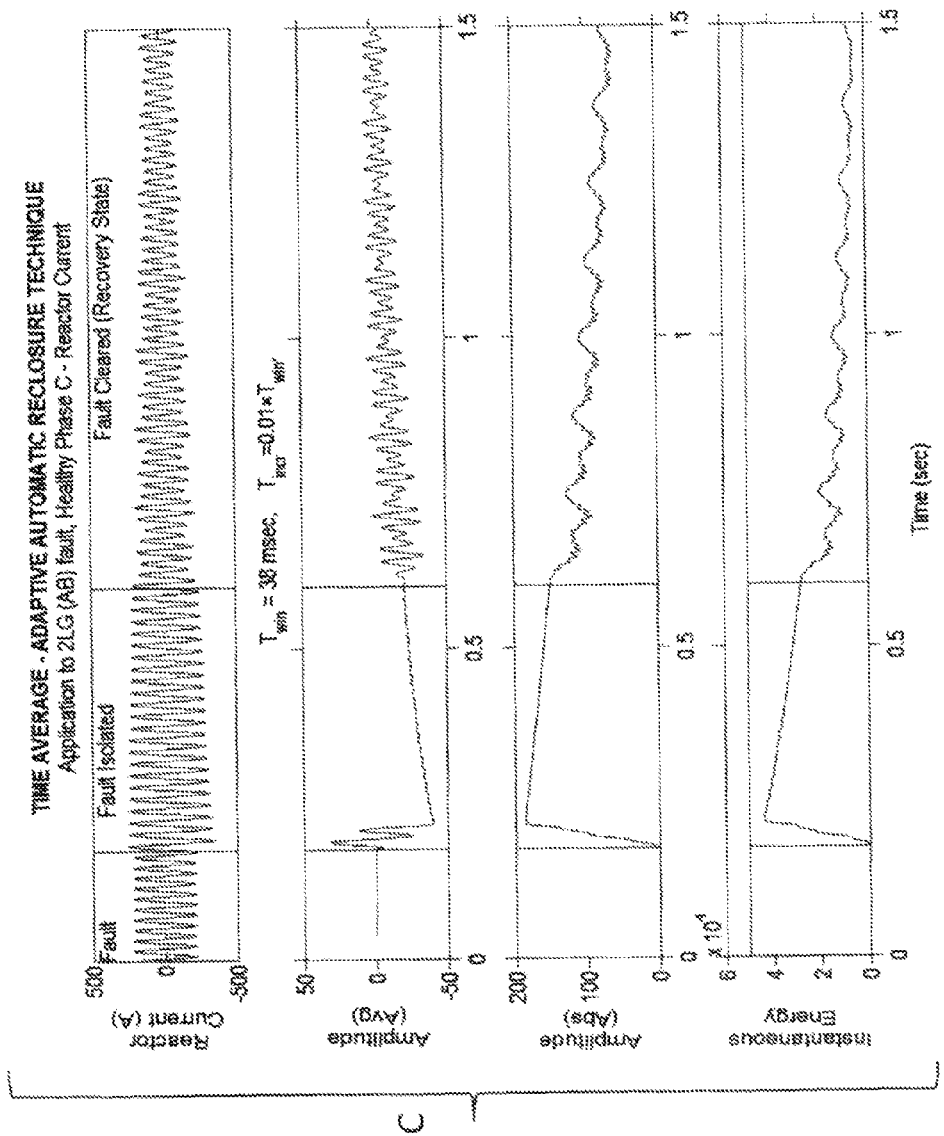
FIG. 5C illustrates the Time Average Calculations Approach considering instantaneous, absolute & square of instantaneous values.

Technique IV: Perform moving window calculations such as weighted time average or weighted summation calculations with fixed window length and check if the calculated value stabilizes to a constant term (or monotonously decay). The constant terms signifies the clearance of fault. Only a non-leakage (or acceptable leakage window) will provide a non-varying (or slightly varying) output. For example, sliding time average of sine wave will be zero at all instants only when the time average window is of integral periods. The time average calculations can be performed either directly using instantaneous quantities, or their derivatives such as absolute amplitude, energy (square of instantaneous) etc. When an even function such as absolute and energy function is used, the time average window length can be reduced by half to improve the response time without affecting the accuracy. FIG. 5C illustrates the application of this technique on NYPA's 765 kV transmission system.

In a similar manner, it is also possible to choose the non-leakage window length corresponding to recovery transients rather than fault transients depicted in FIG. 5C, in which case the variations will happen during fault and monotonous decay will happen in recovery period.

Time Domain Approach:

The time domain detection circuits can be used to extract the time period or frequency content of a filtered transient signal. Some of the ways to determine the period in time domain is by using circuits or algorithms for zero-cross detection, positive/negative peak detection, matching slope detection. The high frequency component corresponds to the average of two modulating signals $$\frac{f_1 + f_2}{2}$$

and the difference corresponds to the modulating signal $$\frac{f_1 - f_2}{2}.$$

Since, the set of natural frequencies are known for a transmission system, the resulting modulated and modulating signal frequencies can be pre-determined and compared against those determined through time-domain feature extraction technique. The zero-cross, peak detection circuits and algorithms are widely used in practice. One way to detect the matching slope on a digital signal (x[n], x[n−1] . . . ) is through difference operator:

$$x[n]-x[n-1]=\pm\text{const} \tag{2}$$

Figure 5D:
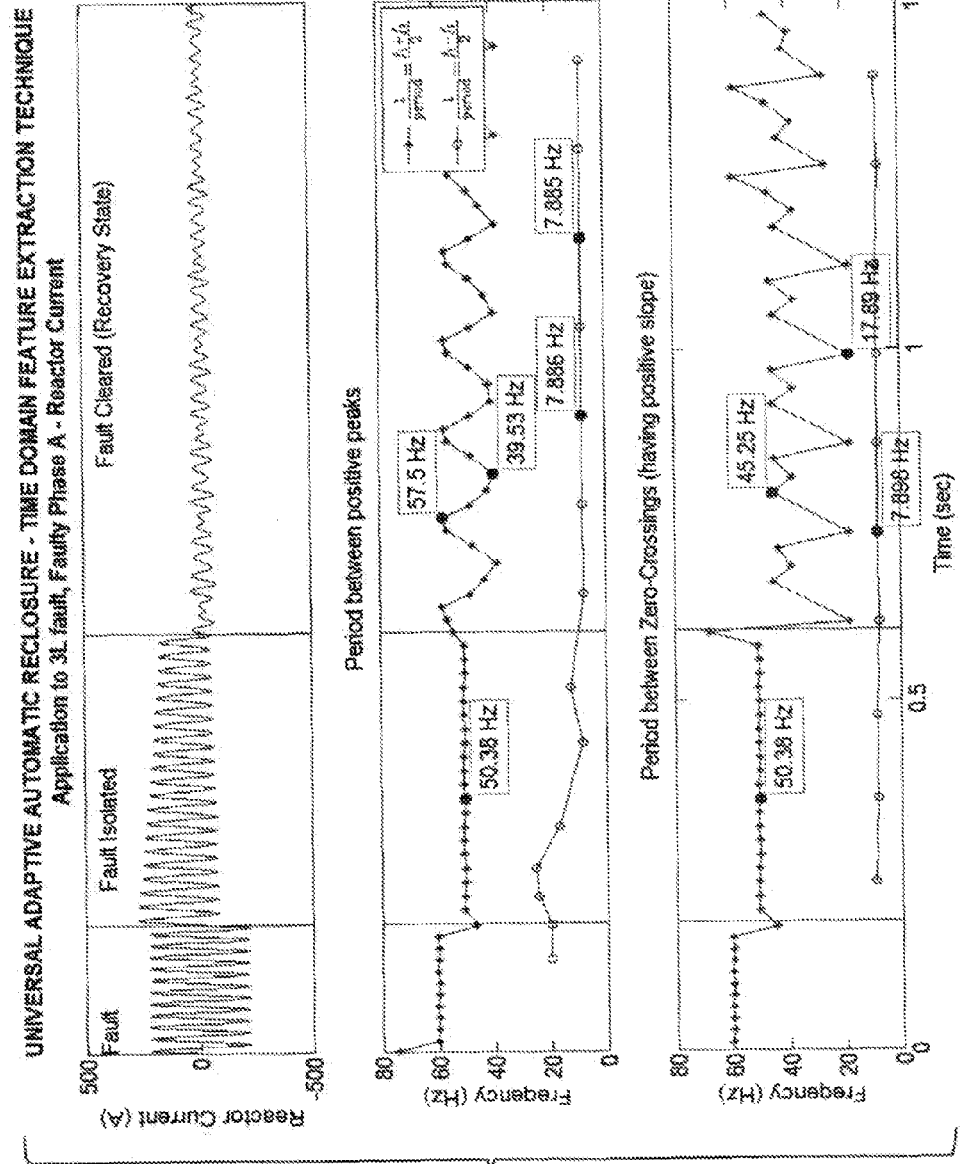
FIG. 5D Illustrates Time Domain Techniques: Frequency determined using zero-crossing and peak detection algorithms

FIG. 5D illustrates the application of zero-cross and peak detection algorithms on NYPA's transmission line system fault transients.

Modal Domain Method

Figure 5E:
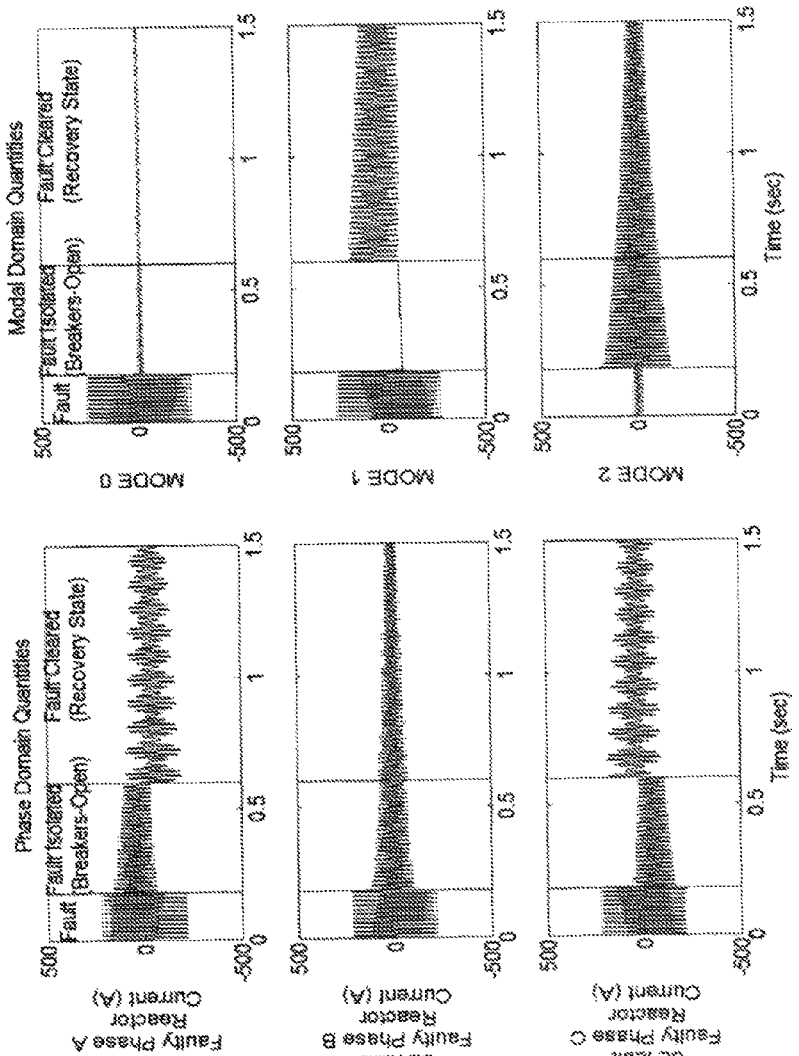
FIG. 5E depicts Modal Domain Transformed Quantities illustrating the single frequency modal quantities.

The phase quantities (voltage and current) on a transmission line can be transformed to modal domain using Eigen transformation matrix. Such a transformation would modify a continuous time varying signal (phase quantity) into independent sinusoidal varying modal quantities. Hence, the frequency of transients can more accurately be determined in modal domain. Change in the state of the transmission line system (fault/secondary arc to recovery state) would result in new and different Eigen modes. Thus, the older transformation matrix would change response (change in frequency, magnitude, new frequency components) in modal domain which can be easily detected using any of the previously defined approaches. FIG. 5E illustrate the phase and modal domain quantities demonstrating the variations.

A healthy isolated untransposed transmission line with shunt reactors has 3 Eigen modes. The relation between the phase domain and Eigen domain can be written as follows $$V_m = T_V^{-1} V_{ph}(t) \tag{3}$$

$$I_m = T_I^{-1} I_{ph}(t) \tag{4}$$

where $V_{ph}$, $I_{ph}$ are phase domain quantities and $V_m$, $I_m$ are modal domain quantities.

$T_V$ & $T_I$ are voltage, current transformation matrices derived from Eigenvalue and Eigenvectors of $V_{ph}$, $I_{ph}$. The method to determine the transformation matrices from transmission line parameters has been in literature from a long time.

Derived Quantity Approach

Figure 5F:
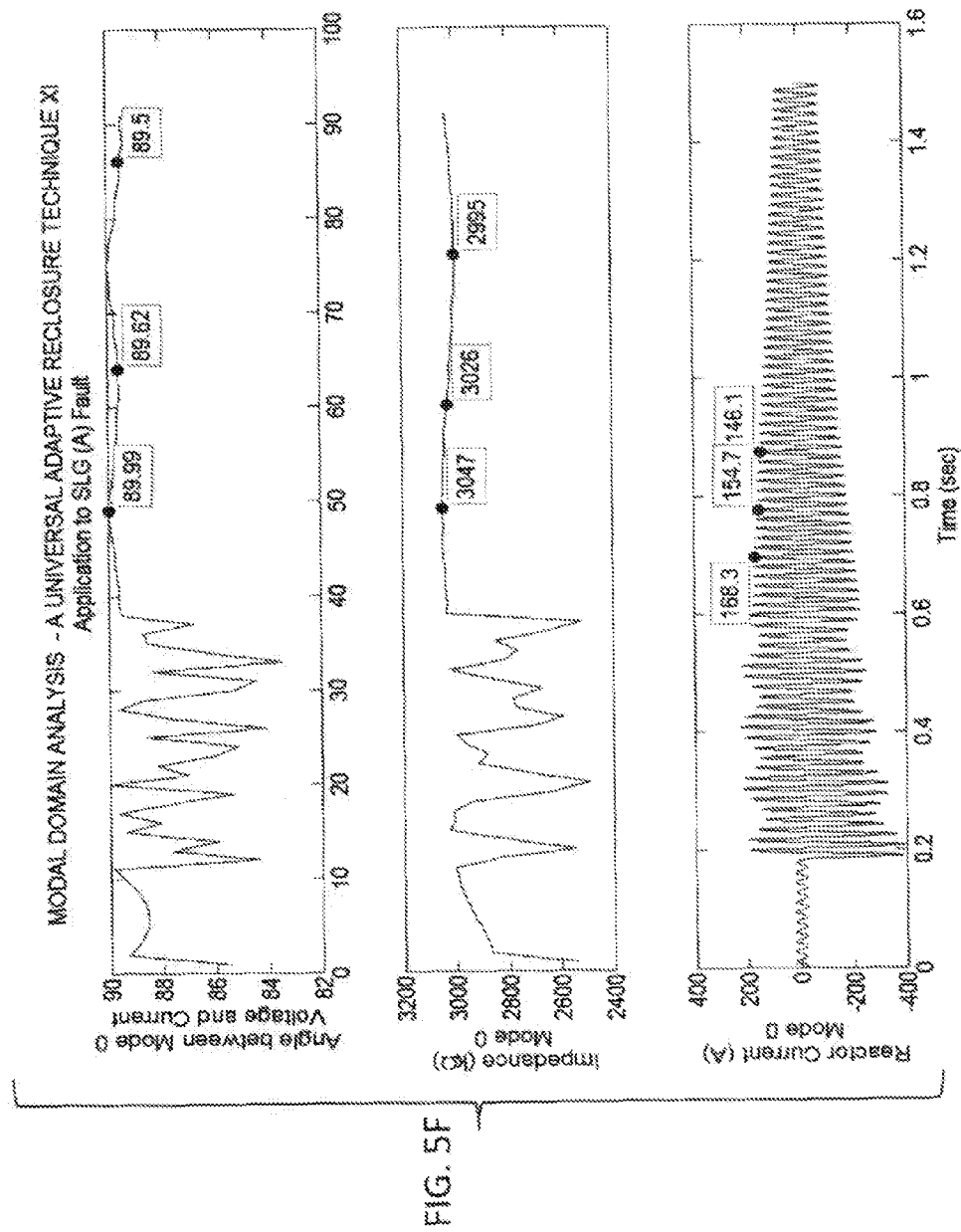
FIG. 5F illustrates the usage of derived quantities (Angle, Impedance of Mode 0) for detecting the instance of fault clearance.

Derived quantities such as impedance/admittance, real power, reactive power, apparent power calculations, angle between voltage and current waveforms or real power and reactive power in time, phase, modal, frequency or wavelet domains can be calculated and compared. Similar to other described approaches, the response of these derived quantities will vary depending on the window length. The window length can either be chosen to capture accurately the fault transients or the recovery transients. FIG. 5F illustrates one such application on modal domain (mode-0) quantity with window length chosen to capture the Mode-0 frequency in recovery state.

Figure 6:
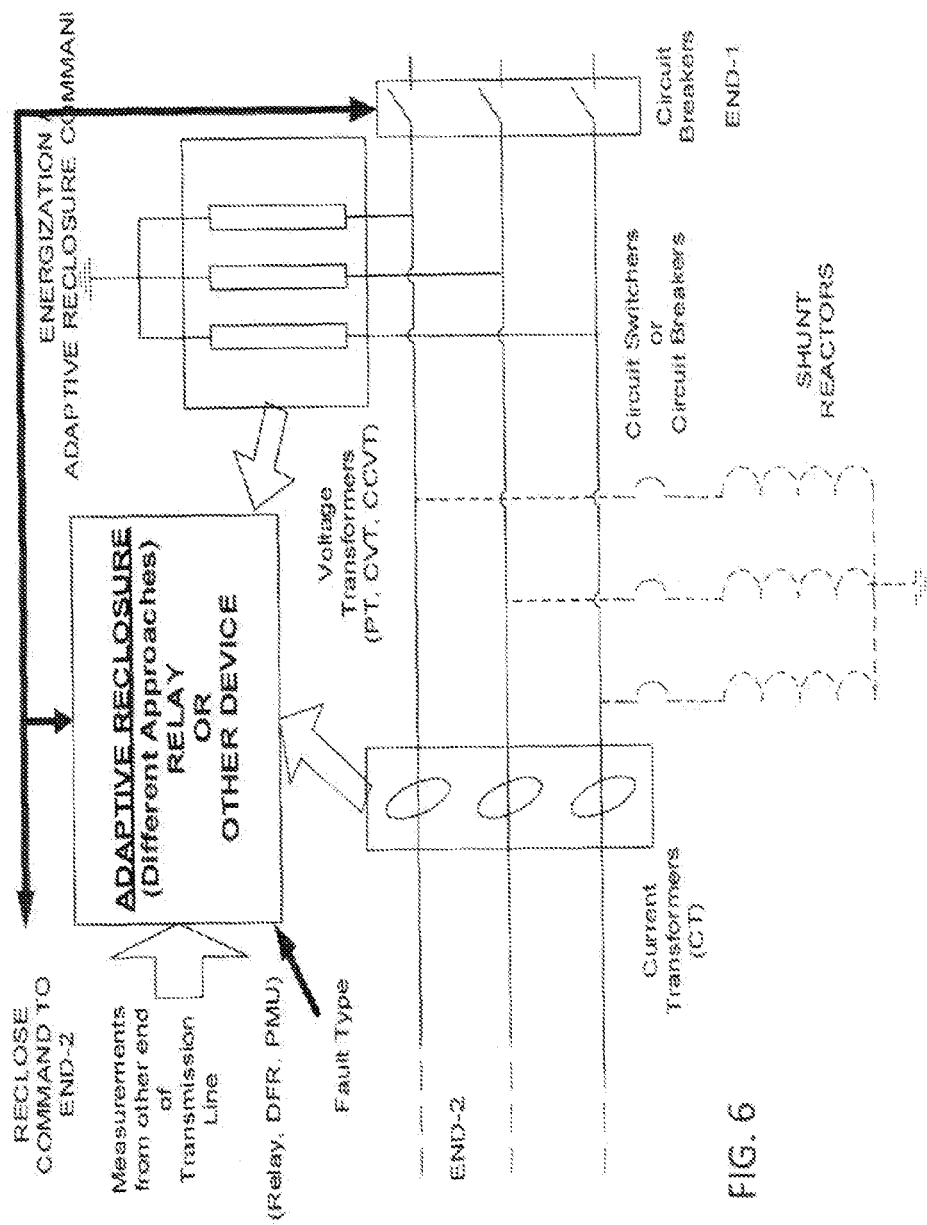
FIG. 6 represents a general block diagram for implementing adaptive reclosure based on the developed methodologies and techniques
Figure 7A:
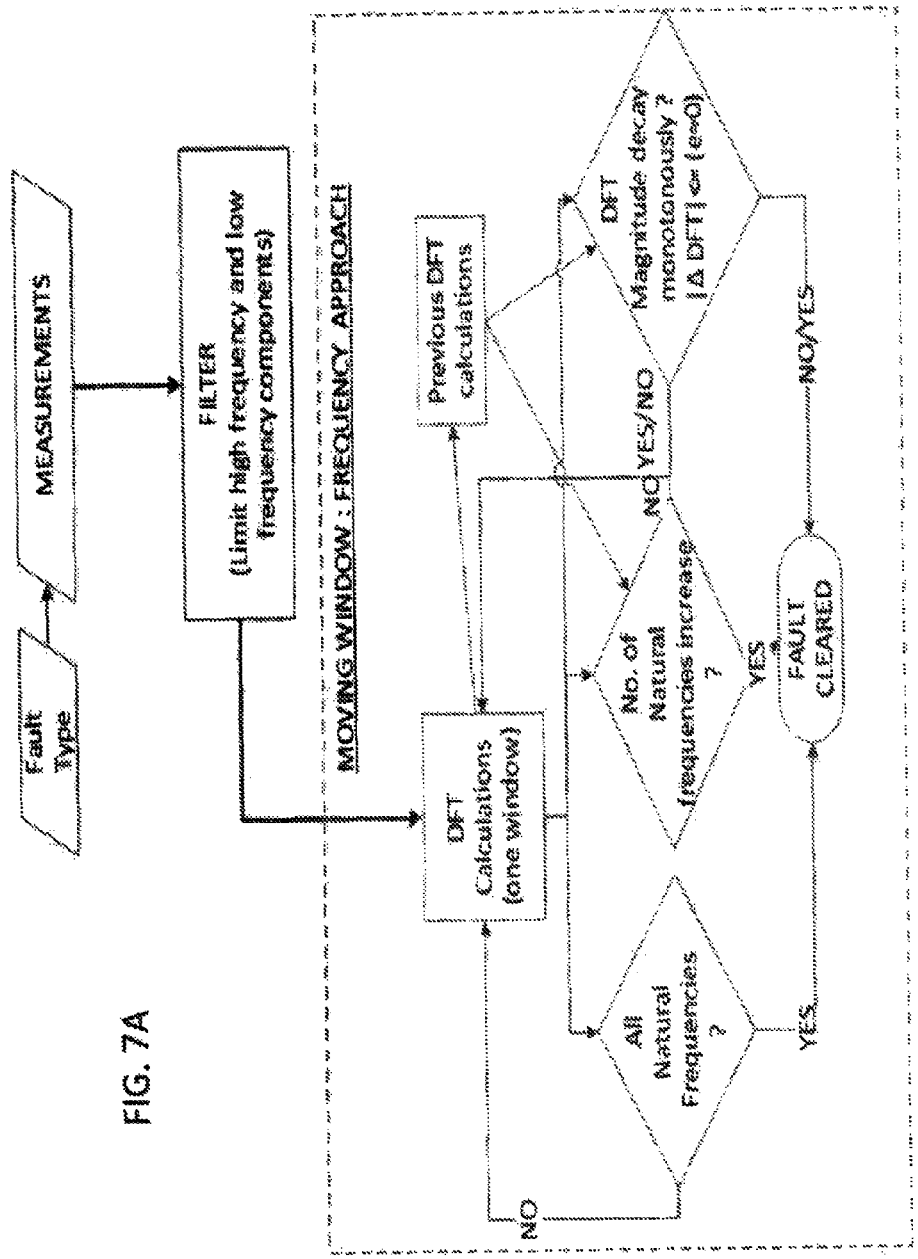
FIG. 7A represents flow chart to implement detection algorithm based on moving window frequency approach
Figure 7D:
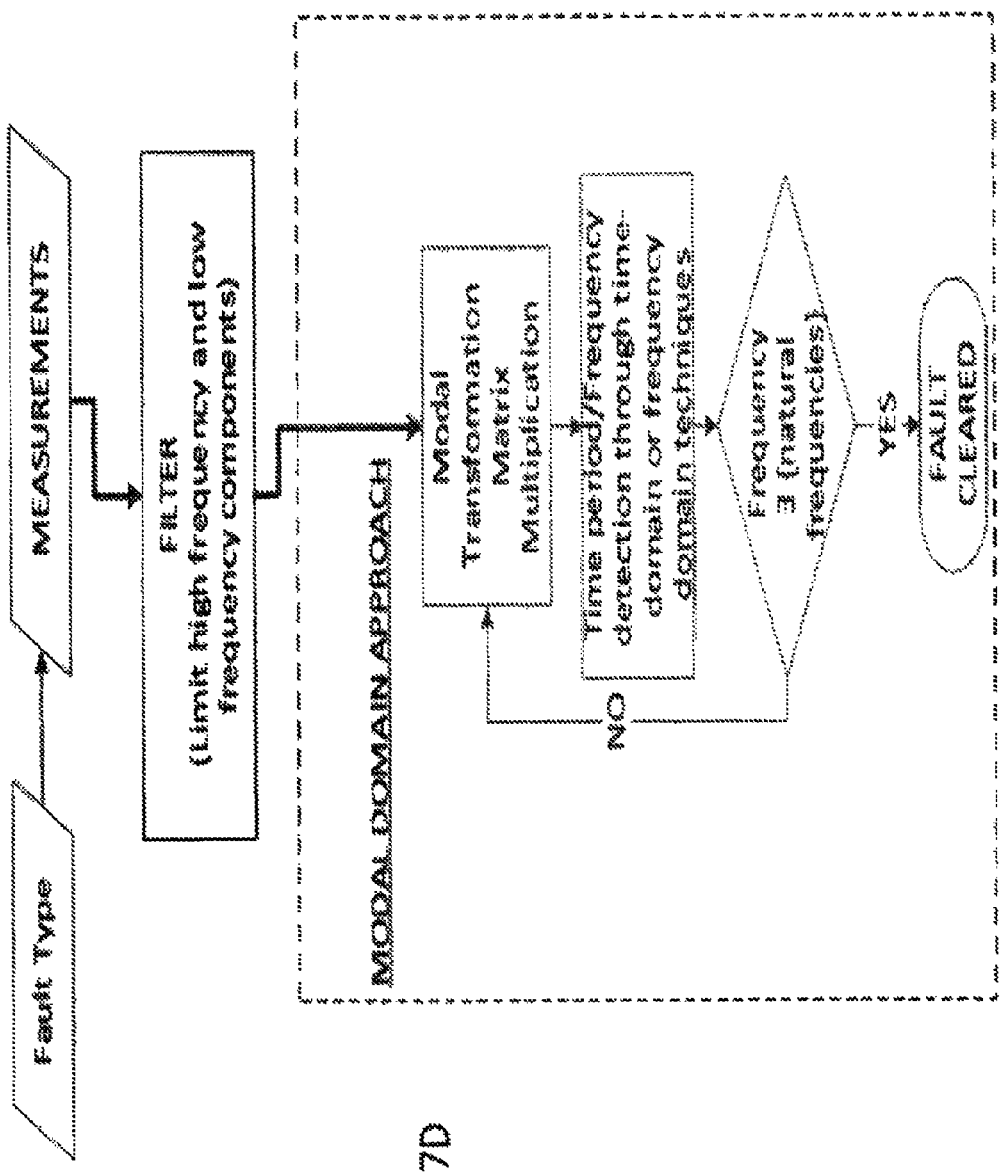
FIG. 7D represents flow chart to implement detection algorithm based on modal domain approach

A general architecture of implementing the fault clearance detection algorithm in an industrial environment is shown in FIG. 6. Any of the existing devices or system such as modern multi-function numeric relays which support magnitude of functions and custom logic could be used for implementation. The description of some of the above stated algorithms are shown in FIG. 7A, 7B, 7C and 7D. In a similar fashion, other methods such as those based on wavelet transforms can also be used to extract the frequency content.

The accuracy and effectiveness of a fault clearance detection algorithm lies in selection of accurate window length. A randomly selected window length or a very long window length has no practical significance and will not be able to detect the fault clearance state with wide-varying fault conditions and types. The frequency/time-period determination is easy and simple when fault or recovery transients compose of single frequency components. When the transients compose of two frequencies components ($f_1$ and $f_2$) added in time domain, they exhibit amplitude modulation characteristics, wherein the lower frequency modulating component is $$\frac{f_1 - f_2}{2}$$

and the higher frequency modulated component is $$\frac{f_1 + f_2}{2}.$$

If a frequency estimation is done through DFT calculation on time domain component, it will be accurate only if a non-leakage time window is chosen containing integral multiple cycles of modulating and modulated signal. The minimum non-leakage window is given as $$\frac{2}{f_1 - f_2}.$$

For a set of three natural frequencies, the resulting non-leakage window will be very long and may bear no practical significance, as longer window lengths delay the detection time and the voltage/current signals also decay exponentially in resistive components resulting in variations and error in frequency estimation. In case of transients composed of three frequencies, one of the ways to calculate the window length ($T_{min}$) with minimum spectral leakage error is:

$$T_1 = \frac{2}{|f_1 - f_2|} = \frac{1}{\Delta f_1}, T_2 = \frac{2}{|f_2 - f_3|} = \frac{1}{\Delta f_2}, \quad (5)$$

$$T_3 = \frac{2}{|f_3 - f_1|} = \frac{1}{\Delta f_2} T_{min} = \max(T_1, T_2, T_3)$$

Another way is to perform transient analysis with variable window lengths and determine the minimum window length with acceptable spectral leakage for each detection type.

Under fault conditions, the resonance frequencies are smaller in number compared to natural set of frequencies, the corresponding non-leakage window length will be shorter can similarly be determined for each fault type. A detection algorithm utilizing characteristics expressed during fault requires fault type detection circuits or algorithm to identify the fault type and the faulty phase such as SLG-A phase, SLG-B Phase, 2LG etc. This information is necessary to dynamically select the parameters such as window length and frequency for fault specific calculations in fault clearance detection and feature extraction algorithms. One way of fault type detection is through the measurement of voltage and currents in all phases and identifying type through relative magnitudes, and/or angle variations between phases; the faulty phase will have higher current, lower voltage and the angle between voltage and current will be close to 90°.

Some resonant frequencies in the healthy/faulty transmission system may be of smaller magnitude compared to other dominant modes. In such situations where their effects may be insignificant, only the dominant frequencies could be considered for configuration and detection.

In addition to frequency and window length parameters, the parameters of a fault detection algorithm would require settling time for allowing the output to stabilize for certain duration. The choice of settling time depends on design requirements such as high speed reclosure requirements, critical clearing times, statistical fault clearing times etc. A fault clearance detection algorithm will also require threshold value for screening the output. The thresholds necessary for frequency detection are dependent on window lengths:

$$\text{Thresholds} \leq (\pm \Delta f \text{ per DFT Sample}) \quad (6)$$

In certain situations, a high/low/band-pass filter may also necessary to limit other frequency components adversely affecting the detection algorithms. The choice of filter has to be designed suiting the application, device/instrumentation errors, resonant frequencies, high frequency transients expressed on transmission line, fault etc.

Since all the detection algorithms are based on frequency contained in the transients and not on instantaneous or absolute magnitude, the threshold determination is dependent on the response time and the window length. None of the techniques have the limitations amongst those described in previous art, wherein the threshold usage determined for one kind of fault may not suit to other kinds of faults.

Some of the protection applications of real-time fault clearance detection algorithms in a shunt compensated transmission line are:

Perform adaptive reclosure on a fault,

Perform adaptive high speed reclosure,

Detect healthy condition in a section of the transmission line especially when underground cable and overhead transmission line form a single circuit, Adaptively actuate special protection system on a power system.

Once the instant of clearance in determined using the above-mentioned techniques, information contained in IEEE C37.104-2002, April 2003 and Chapter-14 of Alstom Inc., "Network Protection and Automation Guide", 2011 for timing the reclosure mechanism can be utilized for each application, the content of which is thus explicitly incorporated by reference.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. More-over, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method of detecting an instance of fault clearance, or distinguishing a temporary versus permanent fault, or detecting a healthy condition in a shunt reactor compensated transmission line consists of following steps, wherein each step could be independently practiced by an entity with a product or a service of one's own or another entity to accomplish each step:

determining a set of unique characteristics expressed by the transmission line with shunt reactor system during fault, secondary arc and fault cleared states for each type of fault;

determining a set of parameters including non-leakage window lengths, acceptable spectral leakage window lengths, modal transformation matrix, time period and frequency for each fault state and type to facilitate accurate feature extraction;

determining a set of feature extraction algorithms along with associated settings, threshold values, and settling times using said set of parameters, wherein said set of feature extraction algorithms either independently or in combination, are used to extract said set of unique characteristics to detect fault state or state transitions; and implementing the said algorithms in systems including protection relays, disturbance monitoring equipment, standalone systems comprising analog, digital, discrete, and memory systems, wherein the said extracted set of unique characteristics from the said feature extraction algorithms are compared against known values representing the said unique characteristics to detect the fault state, or a sudden change in the said extracted set of unique characteristics from the said feature extraction algorithms is used to detect a state change, and wherein the said associated settling times and threshold values are used to qualify the detection of the fault state or the state transition.

2. The method of claim 1, wherein the said unique characteristics consists of resonant frequencies and their relative magnitudes of the transmission line with shunt reactor system.

3. The method of claim 1, wherein the step of determining the set of feature extraction algorithms comprises determining frequency content through moving window calculations including Discrete Fourier Transform (DFT) using non-leakage or acceptable spectral leakage window tuned to capture the frequencies in different states and types of fault representing the said unique characteristics.

4. The method of claim 1, wherein the step of determining the set of-feature extraction algorithms comprises moving window calculations and determining the magnitude response through computations including DFT, discrete cosine transform, discrete sine transform at specified set of frequencies representing the said unique characteristics.

5. The method of claim 1, wherein the step of determining the set of feature extraction algorithms comprises moving window calculations using non-leakage or acceptable leakage window length and determining the magnitude response representing the said unique characteristics through computations including summation of instantaneous values, summation of absolute of instantaneous values and sum of square of instantaneous values.

6. The method of claim 1, wherein the step of determining the set of-feature extraction algorithms comprises determining frequency content representing the said unique characteristics through time-domain detection techniques including peak detection, zero-cross detection, points on wave with matching slopes detection methods.

7. The method of claim 1, wherein the step of determining the set of feature extraction algorithms comprises real-time modal domain transformation, detecting the said unique characteristics in modal domain utilizing another layer of feature extraction algorithms in modal domain.

8. The method of claim 7, wherein said another layer of feature extraction algorithm consists of determining frequency content representing the unique characteristics in modal domain through moving window calculations including Discrete Fourier Transform (DFT) using non-leakage or acceptable spectral leakage window tuned to capture the frequencies in different states and types of fault representing the said unique characteristics.

9. The method of claim 7, wherein said another layer of feature extraction algorithm consists of moving window calculations and determining the magnitude response through computations including DFT, discrete cosine transform, discrete sine transform at specified set of frequencies representing the said unique characteristics in modal domain.

10. The method of claim 7, wherein said another layer of feature extraction algorithm consists of moving window calculations using non-leakage or acceptable leakage window length and determining the magnitude response representing the said unique characteristics in modal domain through computations including summation of instantaneous values, summation of absolute of instantaneous values and sum of square of instantaneous values.

11. The method of claim 7, wherein said another layer of feature extraction algorithm consists of determining frequency content representing the said unique characteristics through time-domain detection techniques including peak detection, zero-cross detection, points on wave with matching slopes detection methods.

12. The method of claim 1, wherein the determining the set of unique characteristics includes analytical, simulation and field measurement approaches performing computations in frequency, time and modal domains.

13. The method of claim 1, wherein the detecting the instance of fault clearance includes detecting an instant of fault clearance.

* * * * *